US006912165B2

(12) United States Patent
Corson et al.

(10) Patent No.: US 6,912,165 B2
(45) Date of Patent: Jun. 28, 2005

(54) METHOD FOR TRANSPARENT UPDATES OF OUTPUT DRIVER IMPEDANCE

(75) Inventors: Phillip L. Corson, Westford, VT (US); Harold Pilo, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 51 days.

(21) Appl. No.: 10/604,867

(22) Filed: Aug. 22, 2003

(65) Prior Publication Data

US 2005/0041480 A1 Feb. 24, 2005

(51) Int. Cl.[7] ............................................. G11C 7/00
(52) U.S. Cl. ........................ 365/189.05; 365/230.06; 365/189.08; 365/189.11; 365/191; 365/206; 365/204
(58) Field of Search ................ 365/189.05, 230.06, 365/189.08, 189.11, 191, 206

(56) References Cited

U.S. PATENT DOCUMENTS

| | | | | |
|---|---|---|---|---|
| 5,414,740 A | * | 5/1995 | Denneau et al. ............. 375/371 |
| 5,666,078 A | | 9/1997 | Lamphier et al. |
| 6,044,031 A | * | 3/2000 | Iadanza et al. ........ 365/230.03 |
| 6,091,645 A | * | 7/2000 | Iadanza ................. 365/189.02 |
| 6,118,310 A | | 9/2000 | Esch, Jr. |
| 6,130,854 A | * | 10/2000 | Gould et al. ............ 365/230.06 |
| 6,163,499 A | | 12/2000 | Suzuki |
| 6,292,407 B1 | | 9/2001 | Porter et al. |
| 6,384,621 B1 | | 5/2002 | Gibbs et al. |
| 6,404,225 B1 | * | 6/2002 | Rangasayee ................. 326/39 |
| 6,429,679 B1 | | 8/2002 | Kim et al. |
| 6,430,606 B1 | * | 8/2002 | Haq ........................... 709/208 |
| 6,576,656 B1 | * | 6/2003 | Tokunaga et al. ........... 514/418 |
| 6,839,286 B2 | * | 1/2005 | Cho et al. .............. 365/189.05 |
| 2002/0118037 A1 | | 8/2002 | Kim et al. |
| 2003/0218914 A1 | * | 11/2003 | Kim et al. ............. 365/189.05 |

* cited by examiner

*Primary Examiner*—Viet Q. Nguyen
(74) *Attorney, Agent, or Firm*—McGinn & Gibb, PLLC; Robert A. Walsh, Esq.

(57) ABSTRACT

Disclosed is a method and structure that controls an output driver by generating an output data path clock signal from a system clock signal and timing the programmable impedance of the output driver according to the output data path clock signal. The method/structure controls the timing of the line driver circuits according to the output data path clock signal. By timing the programmable impedance according to the output data path clock signal, the timing of delivery of an impedance control signal is coordinated with the timing of delivery of data. The method/structure also performs impedance updates on the output driver more frequently during initialization cycles than in cycles that occur after the initialization cycles expire using at least two differently timed clock dividers and a counter.

27 Claims, 3 Drawing Sheets

METHOD FOR TRANSPARENT UPDATES OF OUTPUT DRIVER IMPEDANCE

BACKGROUND OF INVENTION

1. Field of the Invention

The present invention generally relates to solving the problem of updating output driver impedances in a way that is transparent to the user.

2. Description of the Related Art

High performance memories require reliable and well-behaved output driver impedances, and also require transparent impedance updates. As system temperature and voltages drift, periodic impedance updates occur to maintain a near-constant output driver impedance. However, the impedance updates must occur in a manner that does not disrupt bus operation. For example, a binarily-controlled output driver changing from an impedance value of "011111" to "100000" will see a discontinuity in impedance as all bits change. Referring to the previous example, the target impedance of 50-Ohms may see an actual transition from 49-Ohms ("011111") to 120-Ohms ("000000") before returning to the ultimate value of 50-Ohms ("100000"). The impedance discontinuity is very undesirable and causes bus glitches and ultimately timing violations at the receiving device.

Another problem with conventional structures occurs in power-up cycles during initialization and periodicity of updates. Shifts in temperatures normally occur in periods that do not require very frequent updates. However, it is desired to have the optimum impedance after initialization cycles are completed. An impedance system employing Z binary bits require $2^Z$ impedance updates. If impedance updates occur every Y cycles, then the number of power-up cycles is $Y \times 2^Z$. If Z=7 and Y=256, then the number of power-up cycles becomes 32 K, exceeding the application requirements of 1 K.

The invention described below provides a structure and method that eliminates impedance discontinuity and improves startup performance.

SUMMARY OF INVENTION

The invention described below provides an output driver for use with a static random access memory array. With the invention, a clock generator generates an output data path clock signal from a system clock signal. The output data path clock is timed differently than the system clock signal. A programmable impedance system is connected to the clock generator, and the programmable impedance system is timed according to the output data path clock signal. In addition a variable update circuit controls the programmable impedance system to perform impedance updates more frequently during initialization cycles than in cycles that occur after the initialization cycles expire.

The variable update circuit includes at least two differently timed clock dividers and a counter. There also are level translator circuits connected to the programmable impedance system. The level translator circuits each comprise a level translator and a pair of latches. The latches are connected to the clock generator and are timed according to the output data path clock signal. The invention also includes line driver circuits connected to different memory lines in the static random access memory array. Each of the line driver circuits comprises an output data latch, a pre-driver, a mid-driver, and a final stage driver; and the line driver circuits are connected to the clock generator and are timed according to the output data path clock signal. Because the programmable impedance data path is triggered by the clock generator and the line driver circuits are triggered by the clock generator, the timing of delivery of an impedance control signal from the programmable impedance data path circuit to the mid-driver is coordinated with the timing of delivery of data from the pre-driver to the mid-driver.

Thus, the invention controls the output driver by generating an output data path clock signal from a system clock signal and timing the programmable impedance of the output driver according to the output data path clock signal. The invention controls the timing of the line driver circuits according to the output data path clock signal. By timing the programmable impedance according to the output data path clock signal, the timing of delivery of an impedance control signal is coordinated with the timing of delivery of data. The invention also performs impedance updates on the output driver more frequently during initialization cycles than in cycles that occur after the initialization cycles expire using at least two differently timed clock dividers and a counter.

BRIEF DESCRIPTION OF DRAWINGS

The invention will be better understood from the following detailed description with reference to the drawings, in which.

DETAILED DESCRIPTION

Figure 1:
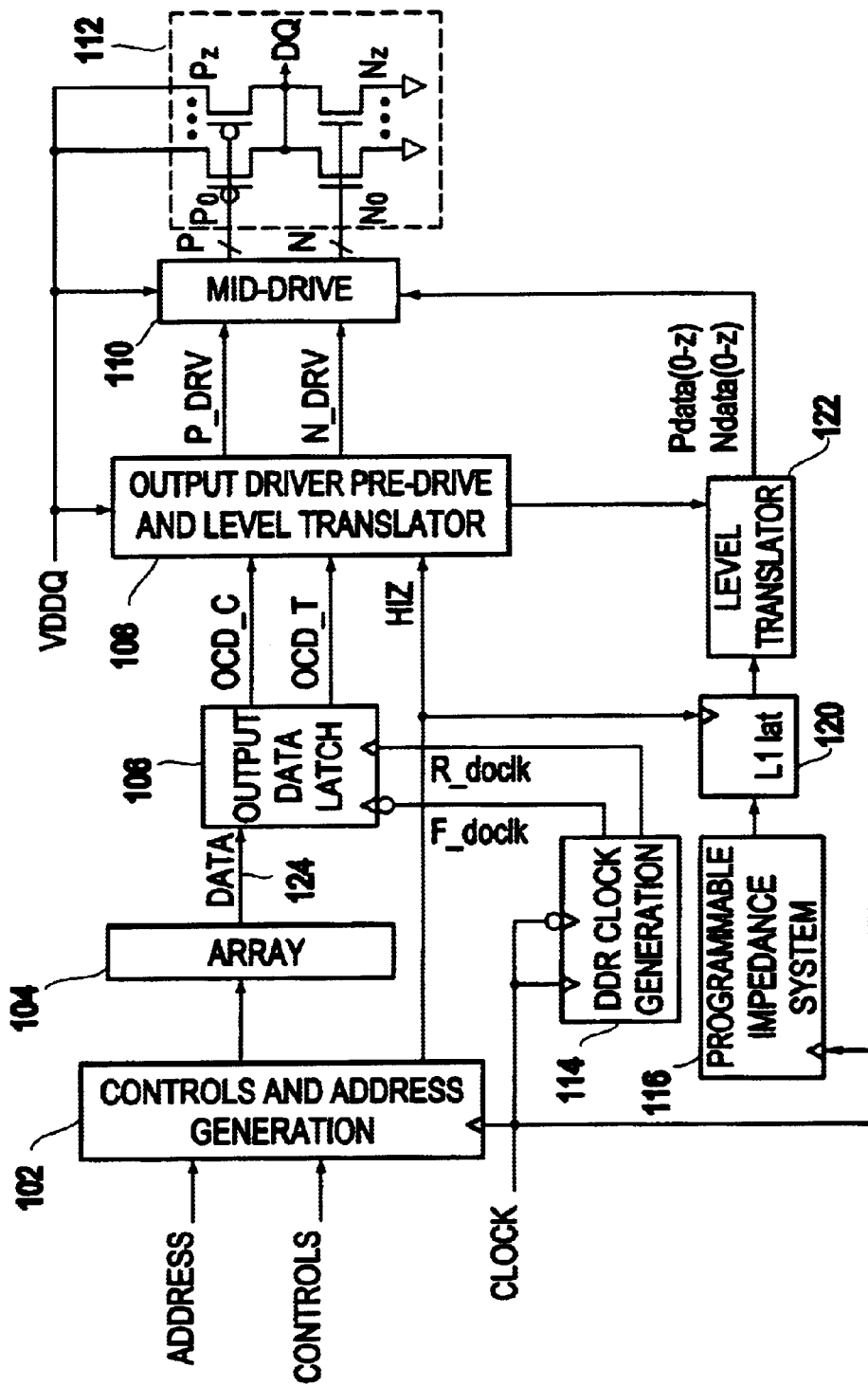
FIG. 1 is a schematic diagram of a prior art driver circuit.

FIG. 1 shows one implementation of how impedance updates can occur. The high-level block diagram of the memory device in FIG. 1 shows an output data latch 106 receiving data from the static random access memory (SRAM) array 104. The latch 106 is clocked in a single or double data rate with (DDR) generator 114 using rising and falling clock signals R_doclk and F_doclk. The true and complement data from the output data latch 106 (OCD_C/T) drives an output driver comprising a pre-drive and level translator circuit 108, a mid-driver 110, and a final stage 112. The final stage 112 comprises an array of binarily weighted P-type and N-type output driver devices. The output pin, DQ, is bi-directional.

Whenever a write occurs, signal HIZ from the controls and address generator 102 places the output driver 108 in HIZ mode, which is the mode in which the driver impedance is updated. More specifically, the programmable impedance system 116 operates the L1 latch 120 to latch a new impedance value when in HIZ mode. The programmable impedance system 116 operates on a divided clock signal (divided by Y) produced by clock divider 118. The value latched in latch L1 is used by the level translator 122 to output Pdata and Ndata that, in turn, control the impedance of the mid-driver 110, and ultimately the impedance output by the driver. However, impedance up-dates can be issued only when the data bus 124 is not operational because the pre-driver 108 cannot simultaneously receive data and the HIZ signal. Further, timing variation between the HIZ signal and the clock make it very difficult to latch the impedance data (Pdata/Ndata).

Figure 2:
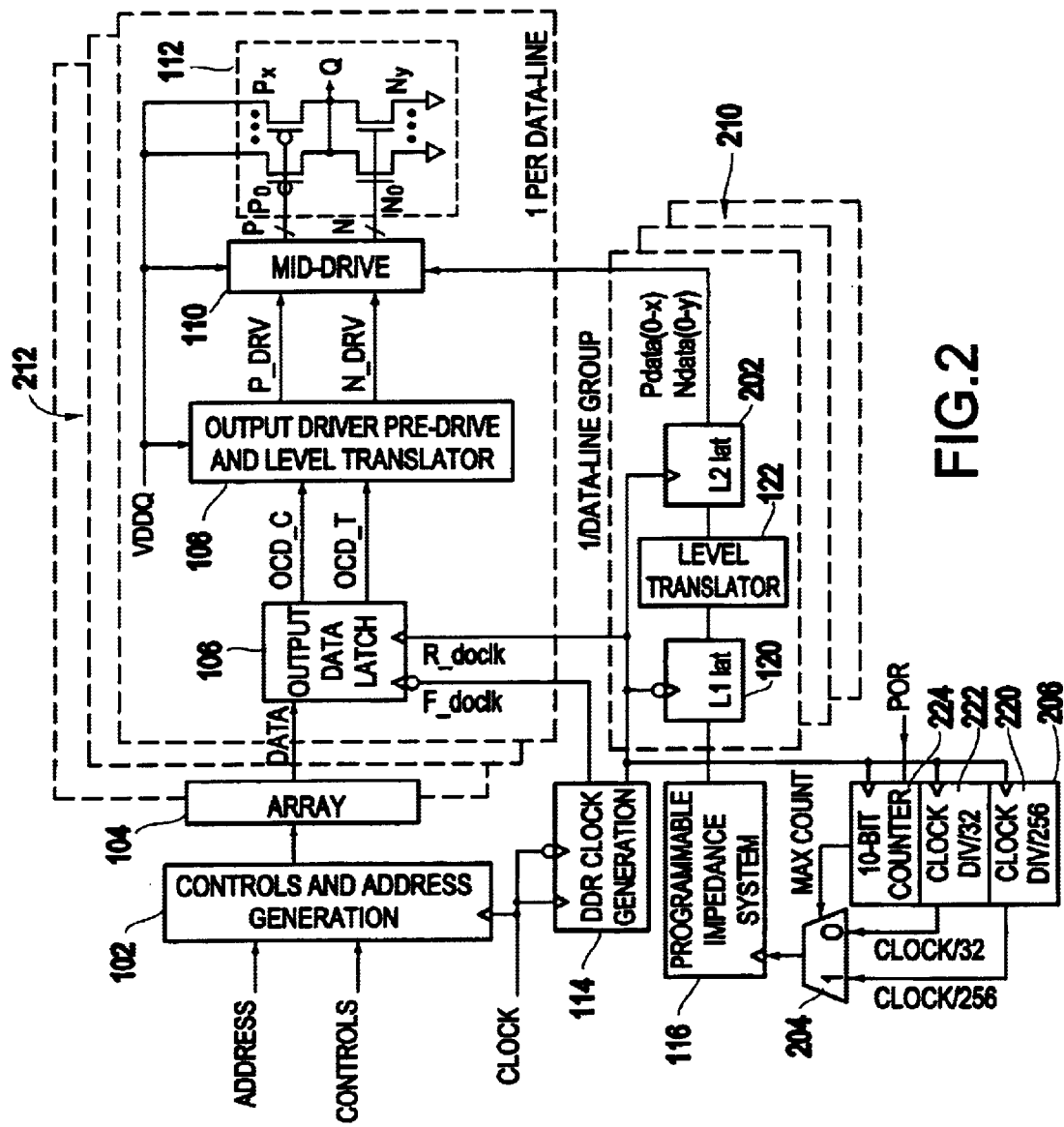
FIG. 2 is a schematic diagram of the present invention driver circuit.

The structure shown in FIG. 1 has two substantial drawbacks. First, the outputs may never go to HIZ and the number of power-up cycles can be very large. The invention shown in FIG. 2 provides a structure and method for allowing transparent impedance updates in separate I/O devices where the output driver may never see a HIZ condition. The invention also improves the power-up requirements and periodicity of updates.

FIG. 2 shows an inventive structure where transparent output impedance updates are achieved by timing the programmable impedance path similarly to the output data path. The clocking domain of the programmable impedance system 116 is changed from the main clock to the output latch clock R_doclk. Changing from the main clock to the output latch clock R_doclk solves two important problems. First, this structure removes any race conditions from the programmable impedance system to the L1 latch. The system drives global impedance data to several L1/L2 latches 120, 202. Each set of latches 210 services one of many groups of data lines 212. Impedance data for each L1/L2 latch 210 is locally captured by the identical R_doclk that launches the array data to the output driver. Therefore, the tracking between output data and programmable impedance data is well controlled.

With the invention shown in FIG. 2, a clock divider 206 divides R_doclk to update the programmable impedance every 32 cycles (at power up), and every 256 cycles thereafter using two dividers 220 (256 divider) and 222 (32 divider), and a 10-bit counter. The logic gate 204 is controlled by the 10-bit counter to limit when the update to the programmable impedance is made. The invention improves the power up requirements for optimum impedance. At power-up, the 10-bit counter 224 selects the path of a clock generated every 32 cycles 222. Thus, for the first 1024 initialization cycles, the programmable impedance is updated every 32 cycles, enough to reach near-optimum impedance. After the 1024 initialization cycles expire, the system is updated every 256 clock cycles by controlling logic device 204 to select the output from 256 clock divider 220. The slow-down in periodicity during normal use decreases the active current and unnecessary impedance updates.

As shown in FIG. 2, the level translation circuitry 122 is placed before the L2 latch 202. This helps Pdata/Ndata signals arrive at the mid-driver 110 slightly before (e.g., less than ½ clock cycle before) the data (N/P_DRV) arrives from the pre-drive 108. Thus, output driver impedance updates occur just prior to new data arriving. Therefore, impedance discontinuities at the time prior to driving data do not affect the signal integrity.

Figure 3:
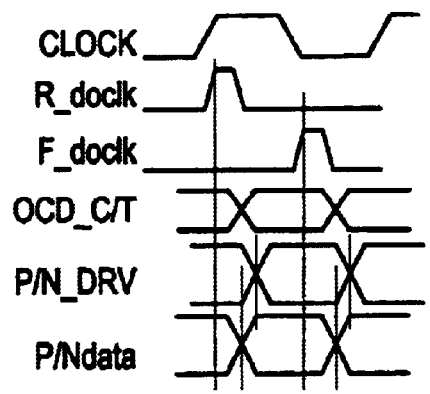
FIG. 3 is a timing diagram showing the relationship between the impedance data and output driver pre-drive data.

FIG. 3 is a timing diagram showing the relationship between the impedance data (P/Ndata) and output driver Pre-drive data (P/N_DRV). Whenever output data clock signal R_doclk pulses, both impedance data (Pdata/Ndata) and output data (OCD_C/OCD_T) are launched to the output driver. Signals Pdata/Ndata arrive at the Mid-Drive section of the Output Driver slightly ahead of data from the output data latch (P_DRV/N_DRV). The resulting waveforms provide an impedance update at a time when output data Q has been driven by the previous falling-edge clock transition (F_doclk). Thus the output data Q has been fully driven to a solid data state by almost a full half-cycle when the impedance update occurs. At the time of the impedance update, any discontinuity in output impedance does not affect the integrity of the data.

Figure 4:
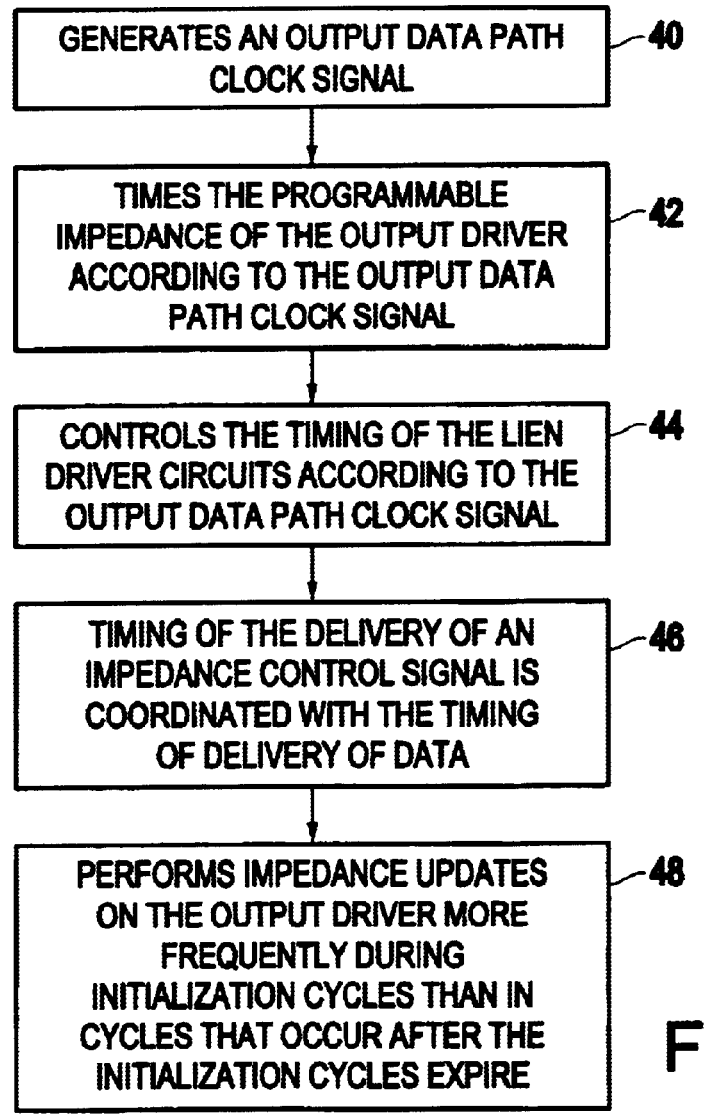
FIG. 4 is a flow diagram illustrating a preferred method of the invention.

As shown in flowchart form in FIG. 4, the invention controls the output driver by generating an output data path clock signal (40) from a system clock signal and times the programmable impedance of the output driver according to the output data path clock signal (42). Thus, the invention controls the timing of the line driver circuits according to the output data path clock signal (44). By timing the programmable impedance according to the output data path clock signal, the timing of delivery of an impedance control signal is coordinated with the timing of delivery of data (46). The invention also performs impedance updates on the output driver more frequently during initialization cycles than in cycles that occur after the initialization cycles expire (48) using at least two differently timed clock dividers and a counter.

Thus, the invention described above provides an output driver for use with a static random access memory array. With the invention, a clock generator generates an output data path clock signal from a system clock signal. The output data path clock is timed differently than the system clock signal. A programmable impedance system is connected to the clock generator, and the programmable impedance system is timed according to the output data path clock signal. In addition a variable update circuit controls the programmable impedance system to perform impedance updates more frequently during initialization cycles than in cycles that occur after the initialization cycles expire.

The variable update circuit includes at least two differently timed clock dividers and a counter. There also are level translator circuits connected to the programmable impedance system. The level translator circuits each comprise a level transistor and a pair of latches. The latches are connected to the clock generator and are timed according to the output data path clock signal. The invention also includes line driver circuits connected to different memory lines in the static random access memory array. Each of the line driver circuits comprises an output data latch, a pre-driver, a mid-driver, and a final stage driver; and the line driver circuits are connected to the clock generator and are timed according to the output data path clock signal. Because the level translation circuit is connected to the clock generator and the line driver circuits are connected to the clock generator, the timing of delivery of an impedance control signal from the level translation circuit to the mid-driver is coordinated with the timing of delivery of data from the pre-driver to the mid-driver.

Thus, the invention controls the output driver by generating an output data path clock signal from a system clock signal and timing the programmable impedance of the output driver according to the output data path clock signal. The invention controls the timing of the line driver circuits according to the output data path clock signal. By timing the programmable impedance according to the output data path clock signal, the timing of delivery of an impedance control signal is coordinated with the timing of delivery of data. The invention also performs impedance updates on the output driver more frequently during initialization cycles than in cycles that occur after the initialization cycles expire using at least two differently timed clock dividers and a counter.

The invention provides transparent impedance updates to an output driver, which improves output data signal integrity. High-performance memory bus operations are limited by the signal characteristics of the input/output bus and driver and receiver circuits that operate the bus. This invention increases the bus performance by improving the signal integrity of the bus. Furthermore, the invention provides the optimum output driver impedance within the power-up initialization cycles provided to the memory.

While the invention has been described in terms of preferred embodiments, those skilled in the art will recognize that the invention can be practiced with modification within the spirit and scope of the appended claims.

What is claimed is:

1. An output driver for use with a random access memory array, said output driver comprising:
    a clock generator for generating an output data path clock signal from a system clock signal, wherein said output data path clock is timed differently than said system clock signal; and
    a programmable impedance system connected to said clock generator, wherein said programmable impedance system is timed according to said output data path clock signal.

2. The output driver in claim 1, further comprising at least one level translator circuit connected to said programmable impedance system, wherein said level translator circuit comprises:
    a level translator; and
    a pair of latches connected to said level translator, wherein said latches are connected to said clock generator and are timed according to said output data path clock signal.

3. The output driver in claim 2, further comprising a plurality of line driver circuits, wherein each line driver circuit is connected to a different memory line in said static random access memory array.

4. The output driver in claim 3, wherein each of said line driver circuits comprises an output data latch, a pre-driver, a mid-driver, and a final stage driver.

5. The output driver in claim 3, wherein all of said line driver circuits are connected to said clock generator and are timed according to said output data path clock signal.

6. The output driver in claim 5, wherein because said level translation circuit is connected to said clock generator and said line driver circuits are connected to said clock generator, the timing of delivery of an impedance control signal from said level translation circuit to said mid-driver is coordinated with the timing of delivery of data from said pre-driver to said mid-driver.

7. The output driver in claim 3, wherein said level translator circuit is connected to at least one of said line driver circuits.

8. An output driver for use with a random access memory array, said output driver comprising:
    a clock generator for generating an output data path clock signal from a system clock signal, wherein said output data path clock is timed differently than said system clock signal;
    a programmable impedance system connected to said clock generator, wherein said programmable impedance system is timed according to said output data path clock signal; and
    a variable update circuit connected to said programmable impedance system, wherein said variable update circuit is adapted to control said programmable impedance system to perform impedance updates more frequently during initialization cycles than in cycles that occur after said initialization cycles expire.

9. The output driver in claim 8, wherein said variable update circuit includes at least two differently timed clock dividers and a counter.

10. The output driver in claim 8, further comprising at least one level translator circuit connected to said programmable impedance system, wherein said level translator circuit comprises:
    a level translator; and
    a pair of latches connected to said level translator, wherein said latches are connected to said clock generator and are timed according to said output data path clock signal.

11. The output driver in claim 10, further comprising a plurality of line driver circuits connected to said clock generator, wherein each line driver circuit is connected to a different memory line in said static random access memory array.

12. The output driver in claim 11, wherein each of said line driver circuits comprises an output data latch, a pre-driver, a mid-driver, and a final stage driver.

13. The output driver in claim 10, wherein all of said line driver circuits are connected to said clock generator and are timed according to said output data path clock signal.

14. The output driver in claim 13, wherein because said level translation circuit is connected to said clock generator and said line driver circuits are connected to said clock generator, the timing of delivery of an impedance control signal from said level translation circuit to said mid-driver is coordinated with the timing of delivery of data from said pre-driver to said mid-driver.

15. The output driver in claim 11, wherein said level translator circuit is connected to at least one of said line driver circuits.

16. An output driver for use with a random access memory array, said output driver comprising:
    a clock generator for generating an output data path clock signal from a system clock signal, wherein said output data path clock is timed differently than said system clock signal;
    a programmable impedance system connected to said clock generator, wherein said programmable impedance system is timed according to said output data path clock signal;
    a plurality of line driver circuits connected to said clock generator, wherein each line driver circuit is connected to a different memory line in said static random access memory array; and
    a plurality of level translator circuits connected to said programmable impedance system, wherein each of said level translator circuits is connected to at least one of said line driver circuits.

17. The output driver in claim 16, wherein each of said level translator circuits comprises:
    a level translator; and
    a pair of latches connected to said level translator, wherein said latches are connected to said clock generator and are timed according to said output data path clock signal.

18. The output driver in claim 16, wherein each of said line driver circuits comprises an output data latch, a pre-driver, a mid-driver, and a final stage driver.

19. The output driver in claim 16, wherein because said level translation circuits are connected to said clock generator and said line driver circuits are connected to said clock generator, the timing of delivery of an impedance control signal from said level translation circuits to said mid-driver is coordinated with the timing of delivery of data from said pre-driver to said mid-driver.

20. The output driver in claim 16, wherein all of said line driver circuits are connected to said clock generator and are timed according to said output data path clock signal.

21. The output driver in claim 16, wherein each of said level translator circuits are connected to a plurality of said line driver circuits.

22. A method controlling an output driver used with a static random access memory array, said method comprising:

generating an output data path clock signal from a system clock signal, wherein said output data path clock is timed differently than said system clock signal; and timing a programmable impedance of said output driver according to said output data path clock signal.

23. The method in claim 22, further comprising performing impedance updates on said output driver more frequently during initialization cycles than in cycles that occur after said initialization cycles expire.

24. The method in claim 22, wherein said process of performing impedance updates utilizes at least two differently timed clock dividers and a counter.

25. The method in claim 22, further comprising controlling the timing of a level translator according to said output data path clock signal.

26. The method in claim 22, further comprising controlling the timing of a plurality of line driver circuits according to said output data path clock signal, wherein each line driver circuit is connected to a different memory line in said static random access memory array.

27. The method in claim 22, wherein by timing said programmable impedance according to said output data path clock signal, the timing of delivery of an impedance control signal is coordinated with the timing of delivery of data.

* * * * *